United States Patent
Lee et al.

(10) Patent No.: US 11,020,777 B2
(45) Date of Patent: Jun. 1, 2021

(54) SUBSTRATE TREATING APPARATUS

(71) Applicant: Semes Co., Ltd., Cheonan-si (KR)

(72) Inventors: Young Hun Lee, Asan-si (KR); Eui Sang Lim, Busan (KR); Jae Myoung Lee, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/700,940

(22) Filed: Dec. 2, 2019

(65) Prior Publication Data
US 2020/0101501 A1   Apr. 2, 2020

Related U.S. Application Data

(62) Division of application No. 14/930,206, filed on Nov. 2, 2015, now abandoned.

(30) Foreign Application Priority Data

Nov. 3, 2014  (KR) .......................... 10-2014-0151457

(51) Int. Cl.
  *B08B 7/00* (2006.01)
  *H01L 21/67* (2006.01)
  (Continued)

(52) U.S. Cl.
  CPC .............. *B08B 7/0021* (2013.01); *B08B 3/02* (2013.01); *F26B 3/04* (2013.01); *F26B 5/005* (2013.01); *F26B 11/18* (2013.01); *F26B 21/14* (2013.01); *H01L 21/6719* (2013.01); *H01L 21/67028* (2013.01); *H01L 21/67051* (2013.01);
  (Continued)

(58) Field of Classification Search
  CPC ......... B08B 7/0021; B08B 3/02; F26B 5/005; F26B 3/04; F26B 21/14; H01L 21/02101; H01L 21/67023; H01L 21/67028; H01L 21/67034; H01L 21/67051;
  (Continued)

(56) References Cited

U.S. PATENT DOCUMENTS

2002/0189543 A1   12/2002   Biberger et al.
2006/0141809 A1   6/2006    Rye et al.
(Continued)

FOREIGN PATENT DOCUMENTS

CN   103035551 A    4/2013
JP   2009038328 A   2/2009
(Continued)

*Primary Examiner* — David G Cormier
(74) *Attorney, Agent, or Firm* — Procopio, Cory, Hargreaves & Savitch LLP (57) ABSTRACT

A substrate treating apparatus is disclosed. The apparatus may include a housing including an upper body and a lower body coupled to each other to define a treatment space, the lower body being provided below the upper body, a supporting unit coupled to the upper body, the supporting unit supporting an edge of a substrate disposed in the treatment space, a fluid supplying unit configured to supply fluid into the treatment space, a sealing member provided between and in contact with the upper and lower bodies, the sealing member hermetically isolating the treatment space from an outer space, and an isolation plate installed between the sealing member and the supporting unit. The isolation plate may be provided to face the sealing member.

5 Claims, 9 Drawing Sheets

(51) Int. Cl.
  *H01L 21/687*   (2006.01)
  *B08B 3/02*     (2006.01)
  *F26B 5/00*     (2006.01)
  *F26B 3/04*     (2006.01)
  *F26B 11/18*    (2006.01)
  *F26B 21/14*    (2006.01)
  *H01L 21/02*    (2006.01)

(52) U.S. Cl.
  CPC .. *H01L 21/67103* (2013.01); *H01L 21/67126* (2013.01); *H01L 21/68742* (2013.01); *B08B 2203/0229* (2013.01); *H01L 21/02101* (2013.01)

(58) Field of Classification Search
  CPC ......... H01L 21/67126; H01L 21/67103; H01L 21/6719; H01L 21/67207
  See application file for complete search history.

(56) References Cited

U.S. PATENT DOCUMENTS

| | | |
|---|---|---|
| 2007/0012339 A1 | 1/2007 | Fukuda et al. |
| 2008/0014358 A1 | 1/2008 | Koo et al. |
| 2013/0145640 A1 | 6/2013 | Lee et al. |
| 2015/0176897 A1 | 6/2015 | Jun et al. |

FOREIGN PATENT DOCUMENTS

| | | |
|---|---|---|
| KR | 1020040033311 A | 4/2004 |
| KR | 1020110101045 A | 9/2011 |
| KR | 101145777 B1 | 5/2012 |
| KR | 1020130063813 A | 6/2013 |
| KR | 101329304 B1 | 11/2013 |

SUBSTRATE TREATING APPARATUS

CROSS-REFERENCE TO RELATED APPLICATIONS

This application is a divisional of U.S. patent application Ser. No. 14/930,206, filed on Nov. 2, 2015, which claims priority under 35 U.S.C. 119 to Korean Patent Application No. 10-2014-0151457, filed on Nov. 3, 2014, in the Korean Intellectual Property Office, the entire contents of which are hereby incorporated by reference.

BACKGROUND OF THE INVENTION

Example embodiments of the inventive concept relate to a substrate treating apparatus, and in particular, to a substrate treating apparatus for cleaning a substrate.

In general, a semiconductor device is fabricated by performing various processes (e.g., a photolithography process, an etching process, an ion implantation process, and a deposition process) on a substrate (e.g., a silicon wafer).

In each process, various foreign substances (e.g., particles, organic contaminants, and metallic impurities) may be produced. The foreign substances may lead to process defects in a subsequent process of treating a substrate and thereby deterioration in performance and yield of a semiconductor device, and thus, in a process of fabricating a semiconductor device, it is necessary to perform a cleaning process for removing such foreign substances.

The cleaning process may include a chemical treating process of removing contaminants from a surface of a substrate using chemicals, a wet cleaning process of removing remaining chemicals from the surface of the substrate using pure or de-ionized water, and a drying process of supplying dehydration fluid on the surface of the substrate to remove remnants of the pure water.

In the past, the drying process was performed in such a way to supply heated nitrogen gas on a substrate, on which pure water remains. However, a reduction in line width or an increase in aspect ratio of patterns led to a great difficulty in removing the pure water from narrow spaces between the patterns. To overcome this problem, in a recent drying process, the remaining pure water on a substrate is replaced with liquid organic solvent (e.g., isopropyl alcohol) having high volatility and low surface tension, compared with the pure water, and then, heated nitrogen gas is supplied to dry the substrate.

However, there is a difficulty in mixing non-polar organic solvent with polar water, and thus, in order to replace the pure water with the liquid organic solvent, it is necessary to supply a large amount of liquid organic solvent onto the substrate for a long time.

Furthermore, although the organic solvent is used for the drying process, for sub-30 nm semiconductor devices, it is difficult to prevent a problem of pattern collapse, and thus, a supercritical drying process is being considered as an alternative to the conventional drying process.

Figure 1:
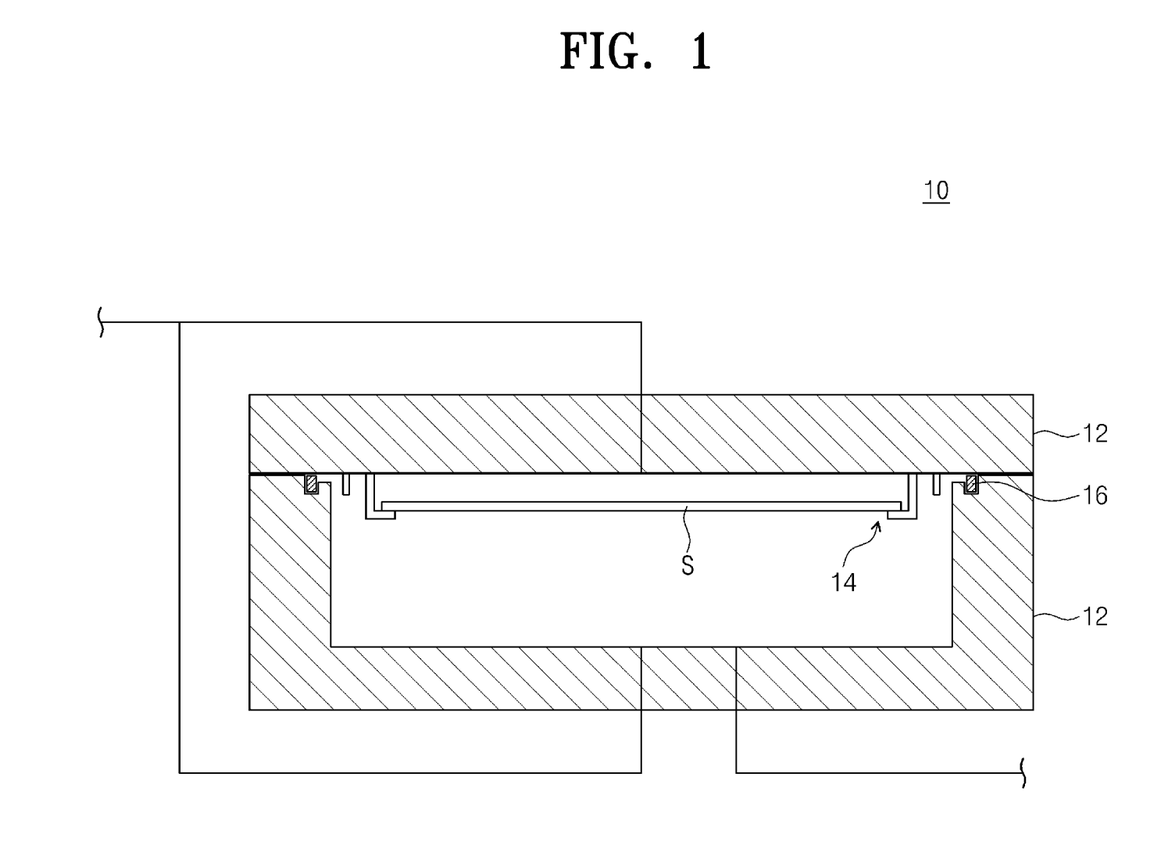
FIG. 1 is a diagram schematically illustrating a conventional substrate treating apparatus for performing a supercritical process.

FIG. 1 is a diagram schematically illustrating a substrate treating apparatus 10 configured to perform a supercritical process. The substrate treating apparatus 10 may include a chamber 12, a supporting unit 14, and a sealing member 16. Since the supercritical drying process is performed using a supercritical fluid, the chamber 12 should be maintained to have a high internal pressure. For this, the chamber 12 is provided to have a hermetically-sealed structure, and moreover, the sealing member 16 is additionally provided to prevent a leakage path from being formed between the chamber 12 and the outside.

However, in a step (e.g., removing the organic solvent) of the supercritical drying process, organic solvent may enter in the sealing member 16 provided in the chamber 12. The entered organic solvent may serve as a source of particles to be accumulated near the sealing member 16.

After the supercritical drying process, the chamber 12 may be opened to unload the substrate S to the outside. At this time, due to a difference in pressure between inner and outer spaces of the chamber 12, the particles accumulated near the sealing member 16 may be moved into the inner space of the chamber 12. Some of such particles may be deposited on a surface of the substrate S. The particles deposited on the substrate S may lead to failures in a subsequent process.

SUMMARY

Example embodiments of the inventive concept provide a substrate treating apparatus, allowing a substrate drying process to be performed with high efficiency.

Example embodiments of the inventive concept provide a substrate treating apparatus capable of preventing particles, which may be produced in a substrate drying process, from flowing onto a substrate and thereby improving process efficiency of the substrate drying process.

According to example embodiments of the inventive concept, provided are substrate treating apparatuses.

According to example embodiments of the inventive concept, a substrate treating apparatus may include a housing including an upper body and a lower body coupled to each other to define a treatment space, the lower body being provided below the upper body, a supporting unit coupled to the upper body, the supporting unit supporting an edge of a substrate disposed in the treatment space, a fluid supplying unit configured to supply fluid into the treatment space, a sealing member provided between and in contact with the upper and lower bodies, the sealing member hermetically isolating the treatment space from an outer space, and an isolation plate installed between the sealing member and the supporting unit. The isolation plate may be provided to face the sealing member.

In some embodiments, the isolation plate may be provided to have a ring shape.

In some embodiments, the isolation plate may be installed to the upper body and may have a downwardly protruding structure, whose bottom is positioned below a top surface of an inner wall of the lower body.

In some embodiments, the supporting unit may include a vertical portion downwardly extending from the upper body, and a horizontal portion inwardly extending from an end portion of the vertical portion toward an inner region of the housing and supporting a bottom surface of the substrate.

In some embodiments, the fluid supplying unit may include an upper fluid supplying part configured to directly supply the fluid onto a top surface of the substrate supported by the supporting unit.

In some embodiments, the fluid supplied through the fluid supplying unit may be a supercritical fluid.

According to example embodiments of the inventive concept, a substrate treating apparatus may include a housing including a lower body defining a treatment space whose top is opened and an upper body coupled to the lower body to veil the treatment space, a supporting unit coupled to the upper body, the supporting unit supporting an edge of a substrate disposed in the treatment space, a fluid supplying unit configured to supply fluid into the treatment space, and a sealing member provided between and in contact with the upper and lower bodies, the sealing member hermetically isolating the treatment space from an outer space. The upper body may include a protruding portion protruding toward the treatment space and facing the substrate disposed on the supporting unit, and the protruding portion may be downwardly extended to have a bottom positioned below a top surface of an inner wall of the lower body.

In some embodiments, the upper body may be provided to include a plurality of recessed regions formed along an edge of the protruding portion, and the supporting unit may be installed to the recessed region.

In some embodiments, the supporting unit may include a vertical portion downwardly extending from the upper body and a horizontal portion inwardly extending from an end portion of the vertical portion toward an inner region of the housing and supporting a bottom surface of the substrate.

In some embodiments, the fluid supplying unit may include an upper fluid supplying part configured to directly supply the fluid onto a top surface of the substrate supported by the supporting unit.

In some embodiments, the fluid supplied through the fluid supplying unit may be a supercritical fluid.

According to example embodiments of the inventive concept, a substrate treating apparatus may include a housing including an upper body defining a treatment space whose bottom is opened and a lower body coupled to a bottom surface of the upper body, a supporting unit coupled to the lower body, the supporting unit supporting an edge of a substrate disposed in the treatment space, a fluid supplying unit configured to supply fluid into the treatment space, and a sealing member provided between and in contact with the upper and lower bodies, the sealing member hermetically isolating the treatment space from an outer space. The sealing member may be positioned below the supporting unit.

In some embodiments, the supporting unit may include a vertical portion upwardly extending from the lower body and a horizontal portion connected to the vertical portion to support a bottom surface of the substrate.

In some embodiments, the substrate treating apparatus may further include an exhausting member provided below the supporting unit to face the substrate disposed on the supporting unit.

In some embodiments, the fluid supplied through the fluid supplying unit may be a supercritical fluid.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a substrate treating system 100 according to example embodiments of the inventive concept will be described.

The substrate treating system 100 may be configured to perform a supercritical process of treating a substrate S using a supercritical fluid as a process fluid.

Here, the substrate S may be one of a variety of substrates, on which circuit patterns (for example, for semiconductor devices, flat panel display (FPD) devices, and so forth) can be formed. As an example, the substrate S may be a silicon wafer, but example embodiments of the inventive concept may not be limited thereto. For example, various substrates, such as wafers, glass substrates, or organic substrates, may be used as the substrate S.

The supercritical process may refer to a process, in which supercritical fluid is used, and may include a supercritical drying process and a supercritical etching process. For the sake of simplicity, the description that follows will refer to an example of the supercritical cleaning process. Example embodiments of the inventive concept may not be limited to these examples; for example, the substrate treating system 100 may be used to perform supercritical processes, other than the supercritical cleaning process.

The supercritical drying process may be performed in such a way that organic solvent remaining between circuit patterns is mixed with supercritical fluid and then the mixture is removed from the substrate S. The use of the supercritical drying process may make it possible to achieve high efficiency in a substrate drying process and to prevent pattern collapse. In the supercritical drying process, at least one of materials having high miscibility with organic solvent may be used as the supercritical fluid. As an example, supercritical carbon dioxide ($scCO_2$) may be used as the supercritical fluid.

Hereinafter, some examples of the substrate treating system 100 according to example embodiments of the inventive concept will be described with reference to the accompanying drawings. In some embodiments, the substrate treating system 100 may be configured to perform a cleaning process (e.g., including a supercritical drying process).

Figure 2:
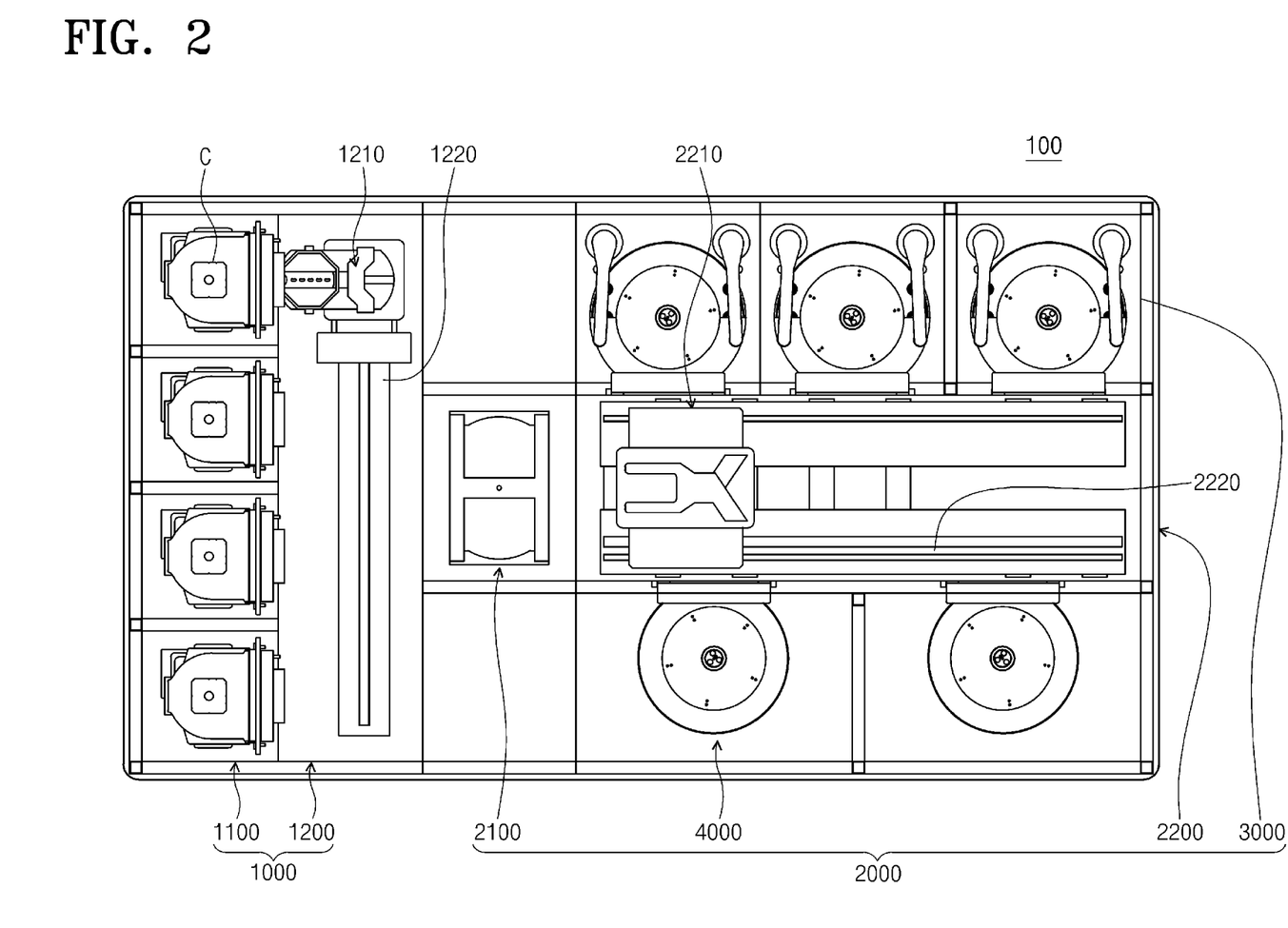
FIG. 2 is a plan view illustrating a substrate treating system according to example embodiments of the inventive concept.

FIG. 2 is a plan view illustrating a substrate treating system according to example embodiments of the inventive concept.

Referring to FIG. 2, the substrate treating system 100 may include an index module 1000 and a process module 2000.

The index module 1000 may be configured to receive a substrate S from the outside and send the substrate S to the process module 2000. In some embodiments, the process module 2000 may be configured to allow a supercritical drying process to be performed therein.

The index module 1000 may serve as an equipment front end module (EFEM) and may include a load port 1100 and a transfer frame 1200.

A carrier C may be provided in the rod port 1100 to contain the substrate S. The carrier C may be provided in the form of a front-opening-unified pod (FOUP). The carrier C may be loaded from the outside to the load port 1100 or may be unloaded from the load port 1100 to the outside by an overhead transfer (OHT) system.

The transfer frame 1200 may be configured to allow the substrate S to be transferred between the carrier C loaded on the rod port 1100 and the process module 2000. The transfer frame 1200 may include an index robot 1210 and an index rail 1220. The index robot 1210 may be configured to move along the index rail 1220 and carry the substrate S.

The process module 2000 may include a buffer chamber 2100, a transfer chamber 2200, a first process chamber 3000, and a second process chamber 4000.

The buffer chamber 2100 may be configured to temporarily store the substrate S, which will be transferred between the index and process modules 1000 and 2000. A buffer slot may be provided in the buffer chamber 2100. The substrate S may be disposed in the buffer slot. For example, the substrate S may be ejected from the carrier C and may be disposed in the buffer slot, by the index robot 1210. A transfer robot 2210 may be provided in the transfer chamber 2200 to allow the substrate S to be ejected from the buffer slot and then be transferred to the first or second process chamber 3000 or 400. In certain embodiments, a plurality of buffer slots may be provided in the buffer chamber 2100, and in this case, a plurality of the substrates S may be disposed in the buffer slots, respectively, of the buffer chamber 2100.

The transfer chamber 2200 may be configured to allow the substrate S to be transferred among the buffer chamber 2100, the first process chamber 3000, and the second process chamber 4000, which are disposed near transfer chamber 2200. The transfer chamber 2200 may include the transfer robot 2210 and a transfer rail 2220. The transfer robot 2210 may be configured to move along the transfer rail 2220 and carry the substrate S.

At least one of the first and second process chambers 3000 and 4000 may be configured to perform a cleaning process. For example, the cleaning process may be sequentially performed in the first and second process chambers 3000 and 4000. As an example, a chemical process, a rinse process, and an organic solvent process constituting the cleaning process may be performed in the first process chamber 3000. A supercritical dry process may be performed in the second process chamber 4000.

Each of the first and second process chambers 3000 and 4000 may be disposed at a side region of the transfer chamber 2200. For example, the first and second process chambers 3000 and 4000 may be disposed at opposite sides of the transfer chamber 2200 to face each other.

A plurality of the first process chambers 3000 and a plurality of the second process chambers 4000 may be provided in the process module 2000. The process chambers 3000 and 4000 may be disposed to have a linear arrangement at a side region of the transfer chamber 2200, a vertically-stacked arrangement, or a vertically-stacked linear arrangement.

The arrangements of the first and second process chambers 3000 and 4000 are not limited to these examples and may be variously modified in consideration of technical issues (e.g., foot-print or process efficiency) associated with the substrate treating system 100.

Figure 3:
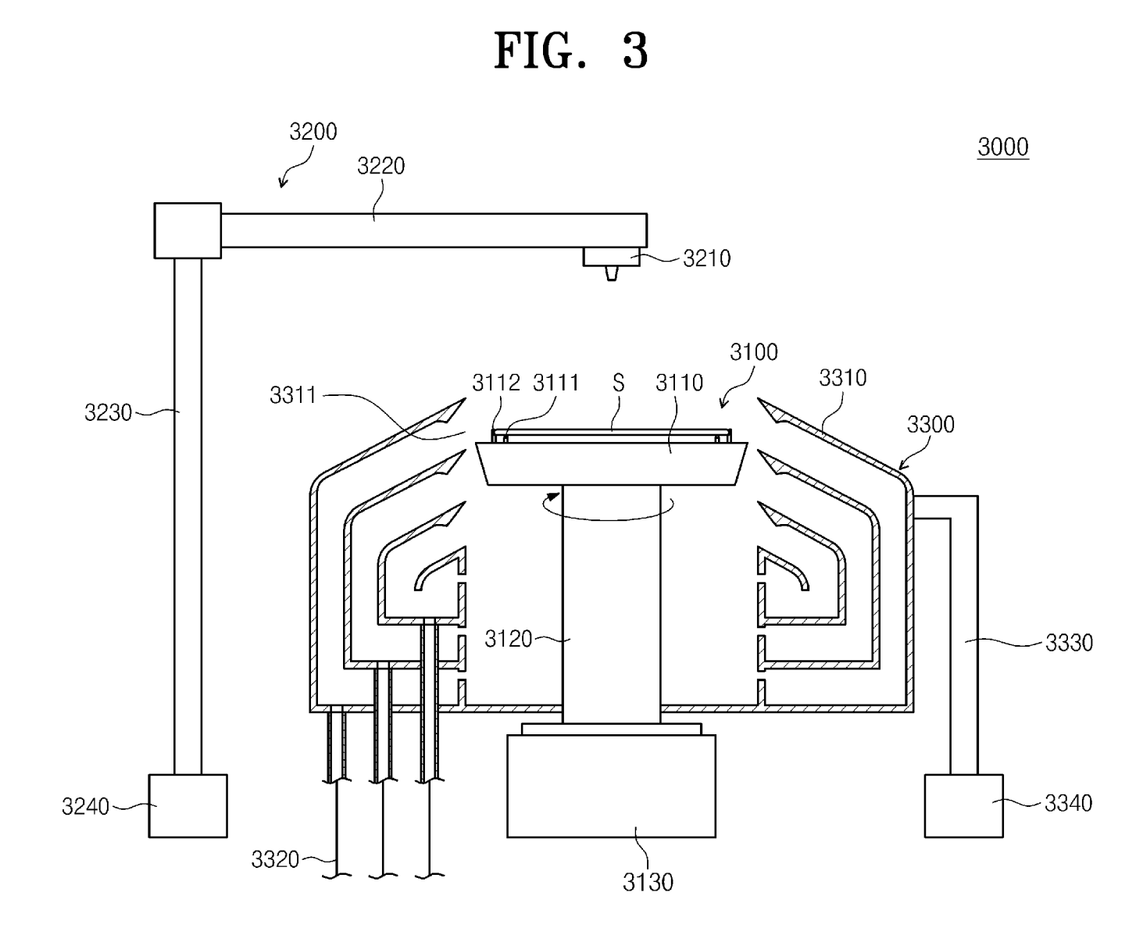
FIG. 3 is a sectional view illustrating an example of the first process chamber of FIG. 2.

Hereinafter, some features of the first process chamber 300 will be described in more detail.

FIG. 3 is a sectional view illustrating the first process chamber of FIG. 2.

The first process chamber 3000 may be configured to perform a chemical process, a rinse process, and an organic solvent process. In certain embodiments, one or some of these processes may be selectively performed in the first process chamber 3000. Here, the chemical process may include supplying a cleaning agent onto the substrate S to remove foreign substances from the substrate S. The rinse process may include supplying a rinse agent onto the substrate S to remove at least a fraction of the cleaning agent remaining on the substrate S. The organic solvent process may include supplying an organic solvent onto the substrate S to replace or substitute the rinse agent remaining between circuit patterns of the substrate S with the organic solvent with low surface tension.

Referring to FIG. 3, the first process chamber 3000 may include a supporting member 3100, a nozzle member 3200, and a collecting member 3300.

The supporting member 3100 may be configured to support the substrate S. The supporting member 3100 may also be configured to rotate the substrate S supported thereby. The supporting member 3100 may include a supporting plate 3110, a supporting pin 3111, a chuck pin 3112, a rotating axis 3120, and a rotating actuator 3130.

The supporting plate 3110 may have a top surface, whose shape is the same or similar to that of the substrate S. The supporting pin 3111 and the chuck pin 3112 may be provided on the top surface of the supporting plate 3110. The supporting pin 3111 may be used to support a bottom surface of the substrate S. The chuck pin 3112 may be used to fasten the substrate S supported by the supporting pin 3111.

The rotating axis 3120 may be connected to a bottom portion of the supporting plate 3110. The rotating actuator 3130 may be configured to rotate the supporting plate 3110 through the rotating axis 3120. Accordingly, the substrate S may be rotated along with the supporting plate 3110. The chuck pin 3112 may prevent the substrate S from being deviated from a normal position thereof.

The nozzle member 3200 may be configured to spray treatment solution onto the substrate S. The nozzle member 3200 may include a nozzle 3210, a nozzle bar 3220, a nozzle axis 3230, and a nozzle axis actuator 3240.

The nozzle 3210 may be configured to spray the treatment solution onto the substrate S loaded on the supporting plate 3110. The treatment solution may be at least one of cleaning agent, rinse agent, or organic solvent. In some embodiments, the cleaning agent may include hydrogen peroxide ($H_2O_2$) solution, hydrogen peroxide solution mixed with ammonia ($NH_4OH$), hydrochloric acid (HCl), or sulfuric acid ($H_2SO_4$), or hydrofluoric acid (HF) solution. The rinse agent may be pure or de-ionized water. The organic solvent may be provided in the form of at least one of solution or gas of isopropyl alcohol, ethyl glycol, 1-propanol, tetra hydraulic franc, 4-hydroxyl, 4-methyl, 2-pentanone, 1-butanol, 2-butanol, methanol, ethanol, n-propyl alcohol, or dimethyl ethyl.

The nozzle 3210 may be provided on a bottom surface of the nozzle bar 3220. The nozzle bar 3220 may be coupled to the nozzle axis 3230. The nozzle axis 3230 may be configured to be moved in a vertical direction or be rotated by the nozzle axis actuator 3240. The nozzle axis actuator 3240 may change a vertical position and/or a rotation angle of the nozzle axis 3230 to adjust a position of the nozzle 3210.

The collecting member 3300 may be configured to retrieve treatment solution supplied onto the substrate S. When the treatment solution is supplied onto the substrate S through the nozzle member 3200, the substrate S may be rotated by the supporting member 3100, and in this case, the whole region of the substrate S may be uniformly covered with the treatment solution. The rotation of the substrate S may lead to an outward scattering of the treatment solution. The collecting member 3300 may be configured to retrieve a fraction of the treatment solution to be scattered from the substrate S.

For example, the collecting member 3300 may include a collecting barrel 3310, a collecting line 3320, a lifting bar 3330, and a lifting actuator 3340.

The collecting barrel 3310 may be provided to have a circular ring-shaped structure enclosing the supporting plate 3110. In some embodiments, the collecting member 3300 may include a plurality of collecting barrels 3310. The collecting barrels 3310 may be provided to have diameters and heights increasing in a direction away from the supporting plate 3110, and, when viewed in a plan view, each of the collecting barrels 3310 may have a ring-shaped structure. The taller the collecting barrel 3310, the farther it is from the supporting plate 3110. A collecting hole 3311 may be formed between the collecting barrels 3310, and thus, a fraction of the treatment solution to be scattered from the substrate S may be retrieved through the collecting hole 3311.

The collecting line 3320 may be connected to the collecting barrel 3310 through a bottom surface of the collecting barrel 3310. The treatment solution collected in the collecting barrel 3310 may be supplied to a treatment solution recycling system (not shown) through the collecting line 3320.

The lifting bar 3330 may be connected to the collecting barrel 3310. Power may be transmitted from the lifting actuator 3340 to the lifting bar 3330, and such power may be used to change a vertical position of the collecting barrel 3310. In the case where a plurality of the collecting barrels 3310 are provided, the lifting bar 3330 may be connected to the outermost one of the collecting barrels 3310. The lifting actuator 3340 may control the lifting bar 3330 to adjust a vertical position of the collecting barrel 3310, and this may make it possible to allow the scattering fraction of the treatment solution to be mainly collected through a selected one of the collecting holes 3311.

Hereinafter, technical features associated with the second process chamber 4000 will be described.

Figure 4:
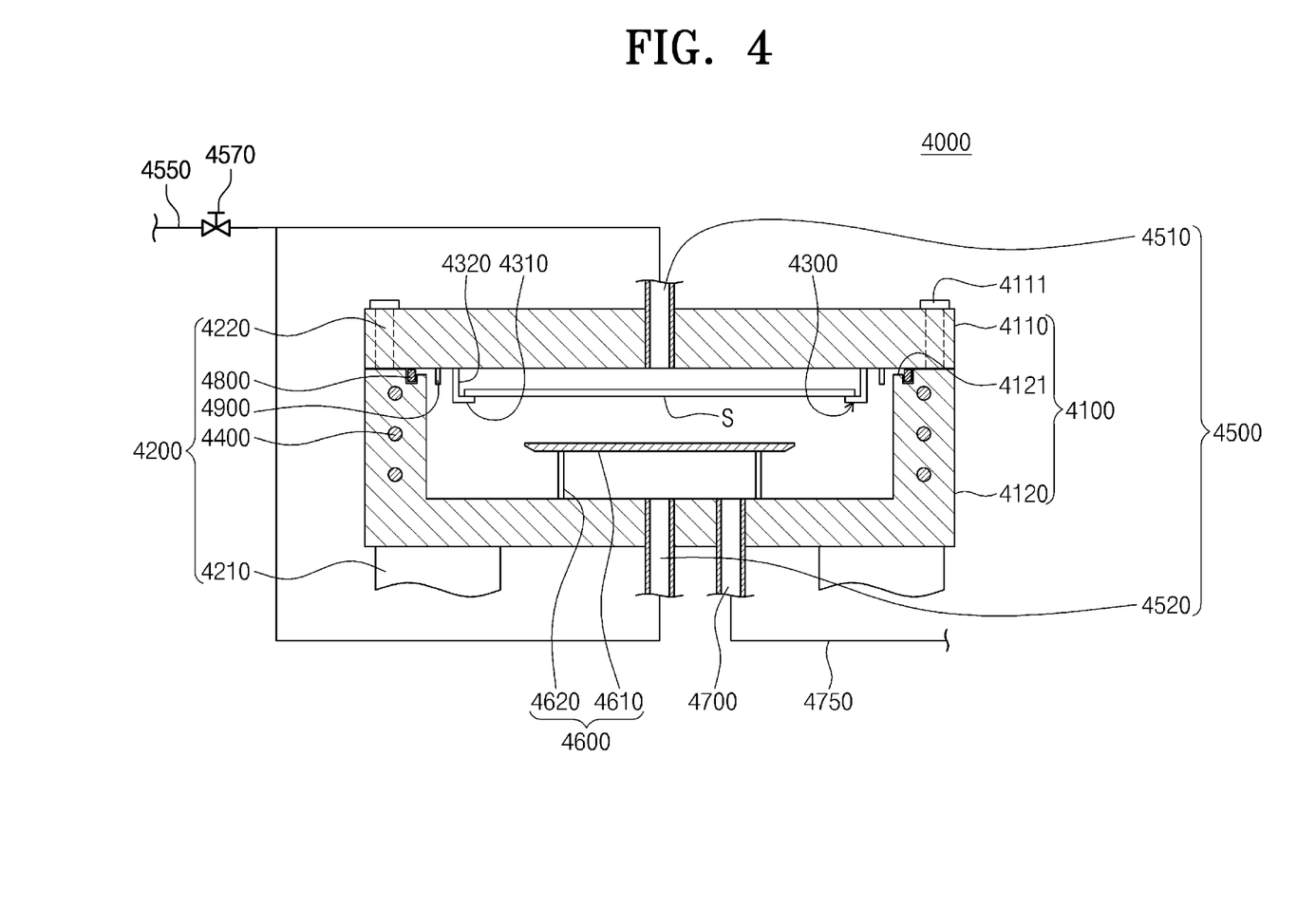
FIG. 4 is a sectional view illustrating an example of the second process chamber of FIG. 2.

The second process chamber 4000 may be configured to perform a supercritical drying process using supercritical fluid. In certain embodiments, the second process chamber 4000 may be configured to perform a supercritical process, other than the supercritical drying process, and moreover, the second process chamber 4000 may be configured to perform a process using any other process fluid, not using the supercritical fluid.

Hereinafter, the second process chamber 400 according to example embodiments of the inventive concept will be described in more detail with reference to FIG. 4.

FIG. 4 is a sectional view illustrating an example of the second process chamber of FIG. 2.

Referring to FIG. 4, the second process chamber 4000 may include a housing 4100, a lifting unit 4200, a supporting unit 4300, a heater 4400, a fluid supplying unit 4500, a blocking member 4600, an exhausting member 4700, a sealing member 4800, and an isolation plate 4900.

The housing 4100 may provide a treatment space, in which the supercritical drying process will be performed. The housing 4100 may be formed of a material capable of enduring a higher pressure than the critical pressure.

The housing 4100 may include an upper body 4110 and a lower body 4120. The lower body 4120 may be coupled to the upper body 4110, below the upper body 4110. A space enclosed by the upper and lower bodies 4110 and 4120 may be used as a treatment space for the substrate treating process.

The upper body 4110 may be fixedly attached to an external structure. The lower body 4120 may be configured to be vertically movable with respect to the upper body 4110. If the lower body 4120 is moved in a downward direction to be spaced apart from the upper body 4110, the treatment space provided in the second process chamber 4000 may be opened. The substrate S may be inserted into or unloaded from the opened treatment space of the second process chamber 4000. When the organic solvent process in the first process chamber 3000 is finished, the substrate S is injected into the second process chamber 4000, and thus, the organic solvent may remain on the substrate S to be injected into the second process chamber 4000. If the lower body 4120 is moved in an upward direction to be in contact with the upper body 4110, the treatment space in the second process chamber 4000 may be hermetically closed. The supercritical drying process may be performed in the closed treatment space. In certain embodiments, the housing 4100 may be configured in such a way that the lower body 4120 is fixed and the upper body 4110 is vertically movable.

The lifting unit 4200 may be used to move the lower body 4120 in a vertical direction. The lifting unit 4200 may include a lifting cylinder 4210 and a lifting rod 4220. The lifting cylinder 4210 may be connected to the lower body 4120 to allow a vertical driving force to be exerted to the lower body 4120. During the supercritical drying process, the magnitude of the vertical driving force exerted through the lifting cylinder 4210 may be high enough to prevent any leakage path from being formed between the upper and lower bodies 4110 and 4120 and thereby to hermetically seal the second process chamber 4000, under a high internal pressure (e.g., higher than the critical pressure) of the second process chamber 4000. The lifting rod 4220 may have a vertically-extended structure including an end portion inserted into the lifting cylinder 4210 and an opposite end portion coupled to the upper body 4110. If the driving force is exerted to the lifting cylinder 4210, the lifting cylinder 4210 and the lifting rod 4220 may be vertically moved to change a vertical position of the lower body 4120 coupled to the lifting cylinder 4210. When the vertical position of the lower body 4120 is changed by the lifting cylinder 4210, the lifting rod 4220 may prevent the upper and lower bodies 4110 and 4120 from moving in a horizon direction and may guide the upper and lower bodies 4110 and 4120 along the vertical direction; that is, the lifting rod 4220 may prevent the upper and lower bodies 4110 and 4120 from being deviated from their normal positions.

The supporting unit 4300 may be provided in the treatment space of the housing 4100 to support the substrate S. The supporting unit 4300 may be coupled to the upper body 4110. The supporting unit 4300 may include a vertical portion 4320 and a horizontal portion 4310.

The vertical portion 4320 may be coupled to the bottom surface of the upper body 4110. The vertical portion 4320 may be provided to extend from the upper body 4110 in a downward direction. The vertical portion 4320 may include an end portion that is perpendicularly connected to the horizontal portion 4310. The horizontal portion 4310 may be provided to extend from the end portion of the vertical portion 4320 toward an inner region of the housing 4100. The substrate S may be disposed on the horizontal portion 4310. For example, the horizontal portion 4310 may be provided to support a bottom surface of an edge region of the substrate S.

Since the supporting unit 4300 may be in contact with the edge region of the substrate S to support the substrate S, the supercritical drying process may be performed on the entire top surface and most of the bottom surface of the substrate S. Here, in the substrate S, the top surface may serve as an active surface provided with patterns and the bottom surface may serve as an inactive surface without any pattern.

The supporting unit 4300 may be coupled to the upper body 4110. The supporting unit 4300 may be configured to support the substrate S in a relatively stable manner, when the lower body 4120 is moved in the vertical direction.

A level adjusting member 4111 may be disposed in the upper body 4110 provided with the supporting unit 4300. The level adjusting member 4111 may be configured to adjust a level or horizontality of the upper body 4110. The adjustment of the level of the upper body 4110 may make it possible to adjust a level or horizontality of the substrate S disposed on the supporting unit 4300.

If the substrate S is inclined during the supercritical drying process, the organic solvent remaining on the substrate S may flow down along the inclined surface of the substrate S. In this case, a portion of the substrate S may be insufficiently or excessively dried, and this may lead to damage of the substrate S. Since the level of the substrate S can be controlled by the level adjusting member 4111, it is possible to prevent this technical issue. In the case where the upper body 4110 is vertically movable and the lower body 4120 is fixed or the supporting unit 4300 is installed to the lower body 4120, the level adjusting member 4111 may be installed to the lower body 4120.

The heater 4400 may be configured to increase an internal temperature of the second process chamber 4000. For example, the supercritical fluid supplied into the second process chamber 4000 may be heated by the heater 4400 to have a predetermined temperature (e.g., higher than a critical temperature), allowing the supercritical fluid to be maintained in its supercritical phase. In other words, if the temperature of the supercritical fluid decreases, the heater 4400 may heat the second process chamber 4000 to allow the supercritical fluid to be maintained in its supercritical phase. The heater 4400 may be buried in a wall of at least one of the upper and lower bodes 4110 and 4120. The heater 4400 may be configured to generate heat using an electric power supplied from the outside.

The fluid supplying unit 4500 may be configured to supply fluid to the second process chamber 4000. The fluid may be a supercritical fluid. As an example, the supercritical fluid may be carbon dioxide.

The fluid supplying unit 4500 may include an upper fluid supplying part 4510, a lower fluid supplying part 4520, a supplying line 4550, and a valve 4570.

The upper fluid supplying part 4510 may be configured to directly supply the supercritical fluid onto the top surface of the substrate S. The upper fluid supplying part 4510 may be connected to the upper body 4110. For example, the upper fluid supplying part 4510 may be connected to a portion of the upper body 4110 facing a center region of the top surface of the substrate S.

The lower fluid supplying part 4520 may be configured to supply the supercritical fluid onto the bottom surface of the substrate S. The lower fluid supplying part 4520 may be connected to the lower body 4120. For example, the lower fluid supplying part 4520 may be connected to a portion of the lower body 4120 facing a center region of the bottom surface of the substrate S.

If the supercritical fluid is supplied to the center regions of the substrate S through the upper and lower fluid supplying parts 4510 and 4520, the supercritical fluid may spread from the center regions toward edge regions of the substrate S, and thus, substantially the entire region of the substrate S may be uniformly covered with the supercritical fluid.

The supplying line 4550 may be connected to the upper and lower fluid supplying parts 4510 and 4520. The supplying line 4550 may be used to send the supercritical fluid supplied from the outside to the upper and lower fluid supplying parts 4510 and 4520.

The valve 4570 may be installed on the supplying line 4550. The valve 4570 may be used to control a flow amount of the supercritical fluid to be supplied to the upper and lower fluid supplying parts 4510 and 4520. In certain embodiments, a controller (not shown) may be further provided to control a switching operation of the valve 4570, and this may make it possible to more precisely adjust flow amount or rate of the supercritical fluid to be supplied in the housing 4100.

The fluid supplying unit 4500 may be controlled in such a way that the supercritical fluid is firstly supplied into the housing 4100 through the lower fluid supplying part 4520. Thereafter, the supercritical fluid may be supplied into the housing 4100 through the upper fluid supplying part 4510. At an initial stage of the supercritical drying process, an inner space of the second process chamber 4000 may have a pressure lower than the critical pressure. In this case, the supercritical fluid supplied into the second process chamber 4000 may be liquefied. The liquefied fluid may fall to the substrate S by gravity, thereby causing damage of the substrate S.

To avoid this technical issue, the supercritical fluid may be firstly supplied through the lower fluid supplying part 4520. For example, the supercritical fluid may be supplied into the second process chamber 4000 through the lower fluid supplying part 4520, until the inner pressure of the second process chamber 4000 reaches the critical pressure. If the inner pressure of the second process chamber 4000 becomes higher than the critical pressure, the supplying of the supercritical fluid through the upper fluid supplying part 4510 may be started. Since the supercritical fluid is firstly supplied through the lower fluid supplying part 4520, not through the upper fluid supplying part 4510, it is possible to prevent the supercritical fluid from being liquefied and falling to the substrate S.

The blocking member 4600 may be configured to prevent the supercritical fluid supplied through the fluid supplying unit 4500 from being directly sprayed the bottom surface of the substrate S. In some embodiments, the blocking member 4600 may include a blocking plate 4610 and a supporter 4620.

The blocking plate 4610 may be positioned in the treatment space of the housing 4100. The blocking plate 4610 may be disposed between the supporting unit 4300 and the lower fluid supplying part 4520. The blocking plate 4610 may be provided in the form of a circular plate. The blocking plate 4610 may have a radius that is similar to or larger than that of the substrate S. The blocking plate 4610 may be positioned below the bottom surface of the substrate S disposed on the supporting unit 4300, and this may make it possible to prevent the supercritical fluid supplied through the lower fluid supplying part 4520 from being directly sprayed the bottom surface of the substrate S. In the case where the radius of the blocking plate 4610 is similar to or larger than that of the substrate S, it is possible to effectively prevent the supercritical fluid from being directly sprayed onto the substrate S.

In certain embodiments, the blocking plate 4610 may be provided to have a radius smaller than that of the substrate S. Even in this case, it is possible to prevent the supercritical fluid from being directly sprayed onto the substrate S. Furthermore, in this case, it is possible to suppress a reduction in speed of the supercritical fluid and thereby to allow the supercritical fluid to arrive easily to the substrate S. In other words, in the case where the blocking plate 4610 is provided to have a smaller radius than the substrate S, the supercritical drying process on the substrate S may be performed with efficiency.

The supporter 4620 may support the blocking plate 4610. The supporter 4620 may be provided to support a back side of the blocking plate 4610. The supporter 4620 may be perpendicularly installed on a bottom wall of the housing 4100. The supporter 4620 and the blocking plate 4610 may be connected to each other without any other jointing member; for example, the supporter 4620 may be laid on the blocking plate 4610 by gravity.

In certain embodiments, the supporter 4620 and the blocking plate 4610 may be connected to a jointing member (e.g., nut or bolt). Alternatively, the supporter 4620 and the blocking plate 4610 may form a single body.

The exhausting member 4700 may be configured to exhaust the supercritical fluid from the second process chamber 4000. The exhausting member 4700 may be connected to an exhausting line 4750 to exhaust the supercritical fluid to the outside. Here, a valve (not shown) may be installed on the exhausting member 4700 or the exhausting line 4750 to control an exhausting amount or rate of the supercritical fluid. In some embodiments, the supercritical fluid exhausted through the exhausting line 4750 may be released into the atmosphere or supplied to a supercritical fluid recycling system (not shown). The exhausting member 4700 may be coupled to the lower body 4120.

At a final state of the supercritical drying process, the supercritical fluid may be exhausted from the second process chamber 4000, and thus, the internal pressure of the second process chamber 4000 may be lowered below the critical pressure of the fluid and the fluid may be liquefied. The liquefied supercritical fluid may be exhausted through the exhausting member 4700 of the lower body 4120, by the gravity.

The sealing member 4800 may hermetically seal the treatment space. The sealing member 4800 may be provided between the upper body 4110 and the lower body 4120 to be in contact with them. In some embodiments, the sealing member 4800 may be provided to have a ring shape; for example, the sealing member 4800 may be an O-ring.

The isolation plate 4900 may be configured to prevent the substrate S from being contaminated by particles. The isolation plate 4900 may be coupled to the upper body 4110. The isolation plate 4900 may be provided to have a ring shape. The isolation plate 4900 may be provided between the sealing member 4800 and the supporting unit 4300. The isolation plate 4900 may be provided to face the sealing member 4800. The isolation plate 4900 may extend from the upper body 4110 in a downward direction. The isolation plate 4900 may have a downwardly-protruding structure, whose bottom is positioned at a lower level of a top surface 4121 of an inner wall of the lower body 4120.

Figure 7:
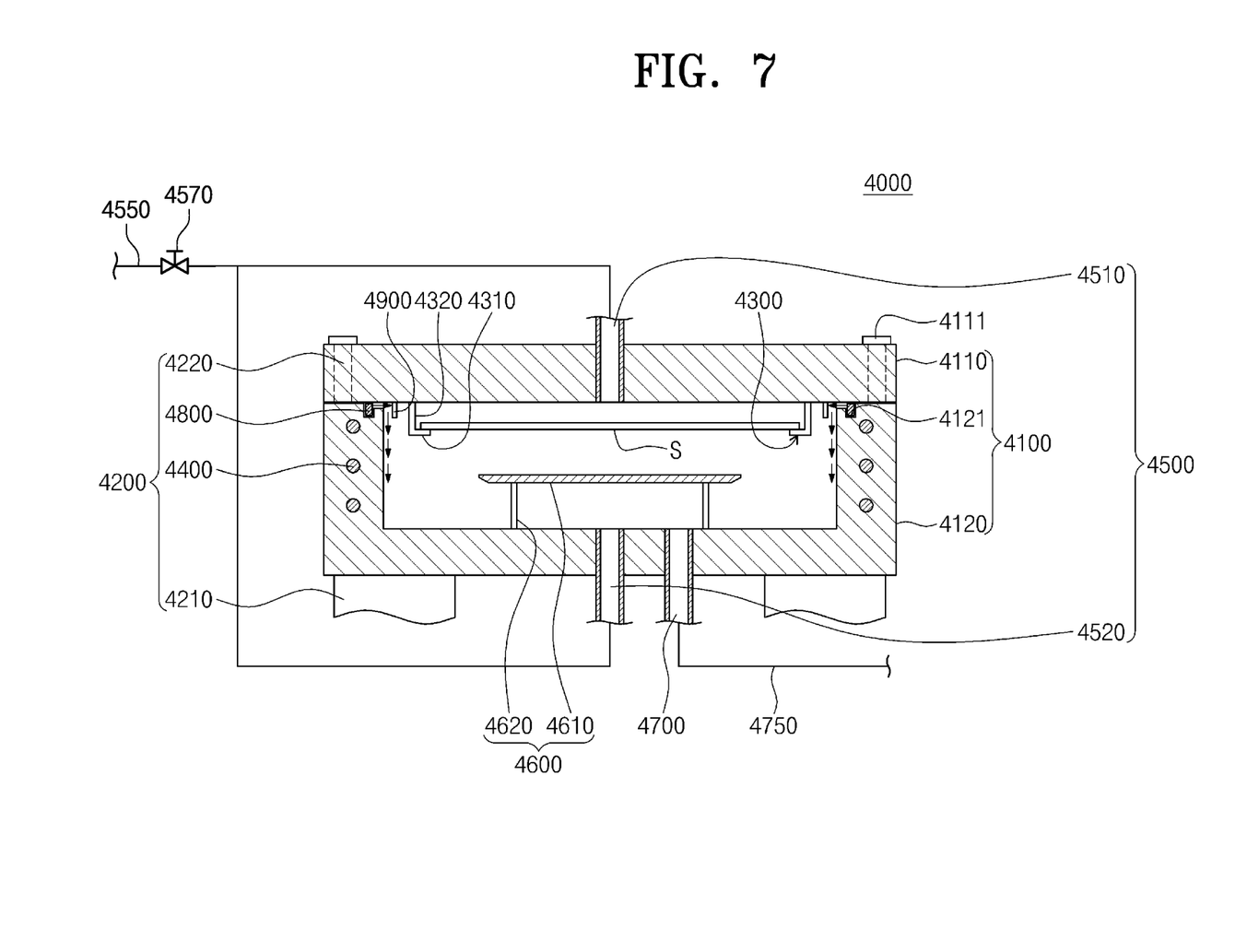
FIG. 7 is a diagram schematically illustrating an aspect of particle movement which may occur near a sealing member of the second process chamber of FIG. 4.

FIG. 7 is a diagram schematically illustrating an aspect of particle movement which may occur near a sealing member of the second process chamber of FIG. 4. In FIG. 7, an arrow schematically represents a trajectory of particles in the second process chamber. As shown in FIG. 7, particles may be produced during the substrate treating process. The particles may result from isopropyl alcohol (IPA). The particle may be deposited on the sealing member 4800. When an inner pressure of the housing 4100 is decreased after the supercritical dry process, the particles may be moved onto the substrate S, due to a difference in pressure between the inner and outer spaces of the housing 4100.

However, according to example embodiments of the inventive concept, since the isolation plate 4900 is provided between the sealing member 4800 and the supporting unit 4300, it is possible to reduce the number of particles moving toward the substrate S after the supercritical drying process and thereby to improve efficiency of the substrate cleaning process.

Figure 5:
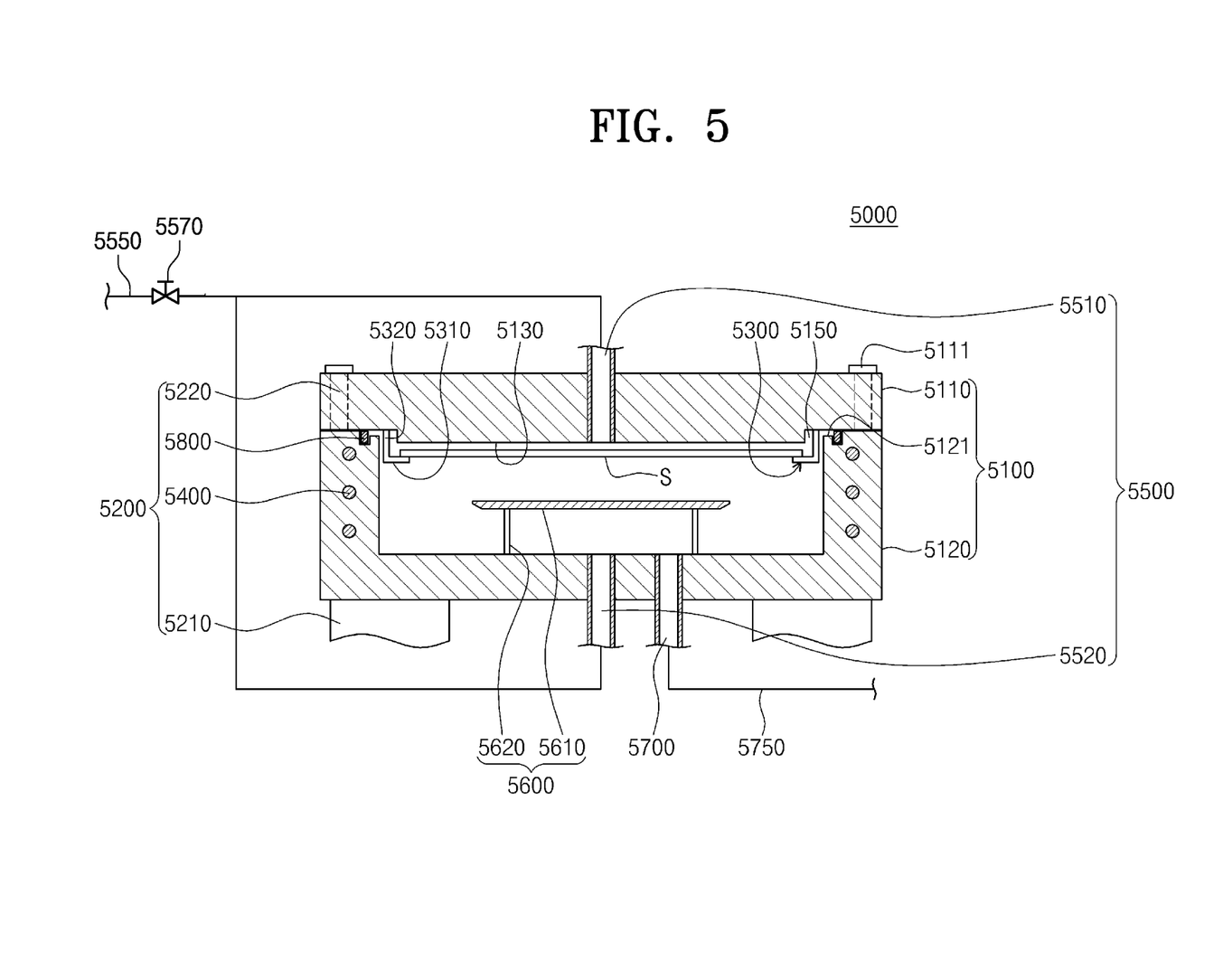
FIG. 5 is a sectional view illustrating another example of the second process chamber of FIG. 2.

FIG. 5 is a sectional view illustrating another example of the second process chamber of FIG. 2.

Referring to FIG. 5, a second process chamber 5000 may include a housing 5100, a lifting unit 5200, a supporting unit 5300, a heater 5400, a fluid supplying unit 5500, a blocking member 5600, an exhausting member 5700, and a sealing member 5800.

In the example embodiments shown in FIG. 5, the lifting unit 5200, the supporting unit 5300, the heater 5400, the fluid supplying unit 5500, the blocking member 5600, the exhausting member 5700, and the sealing member 5800 of the second process chamber 5000 may be configured to have substantially the same features as the lifting unit 4200, the supporting unit 4300, the heater 4400, the fluid supplying unit 4500, the blocking member 4600, the exhausting member 4700, and the sealing member 4800 of the second process chamber 4000 described with reference to FIG. 4.

The housing 5100 may provide a treatment space, in which the supercritical drying process will be performed. The housing 5100 may be formed of a material capable of enduring a higher pressure than the critical pressure.

The housing 5100 may include an upper body 5110 and a lower body 5120. The lower body 5120 may be configured to provide a space whose top is opened. The upper body 5110 may be coupled to an upper portion of the lower body 5120. The upper body 5110 may be provided to cover the lower body 5120. A space enclosed by the upper and lower bodies 5110 and 5120 may be used as a treatment space for the substrate treating process.

The upper body 5110 may be installed in a fixed manner. The lower body 5120 may be configured to be movable in a vertical direction. If the lower body 5120 is moved in a downward direction to be spaced apart from the upper body 5110, the treatment space provided in the second process chamber 5000 may be opened. The substrate S may be inserted into or unloaded from the opened treatment space of the second process chamber 5000. When the organic solvent process in the first process chamber 3000 is finished, the substrate S is injected into the second process chamber 5000, and thus, the organic solvent may remain on the substrate S to be injected into the second process chamber 5000. If the lower body 5120 is moved in an upward direction to be in contact with the upper body 5110, the treatment space in the second process chamber 5000 may be hermetically closed. The supercritical drying process may be performed in the closed treatment space. In certain embodiments, the housing 5100 may be configured in such a way that the lower body 5120 is fixed and the upper body 5110 is vertically movable.

The upper body 5110 may be provided to include a protruding portion 5130 and a recessed region 5150. The protruding portion 5130 may have a downwardly protruding structure. The protruding portion 5130 may be provided to face the substrate S laid on the supporting unit 5300. The protruding portion 5130 may extend to have a bottom positioned at a lower level than a top surface 5121 of an inner wall of the lower body 5120. The protruding portion 5130 may prevent particles from moving onto the substrate S.

The recessed region 5150 may be formed along an edge of the protruding portion 5130. In certain embodiments, the upper body 5110 may be provided to include a plurality of the recessed regions 5150. The supporting unit 5300 may be provided in the recessed region 5150. The sealing member 5800 may be provided to be adjacent to the recessed region 5150.

Figure 8:
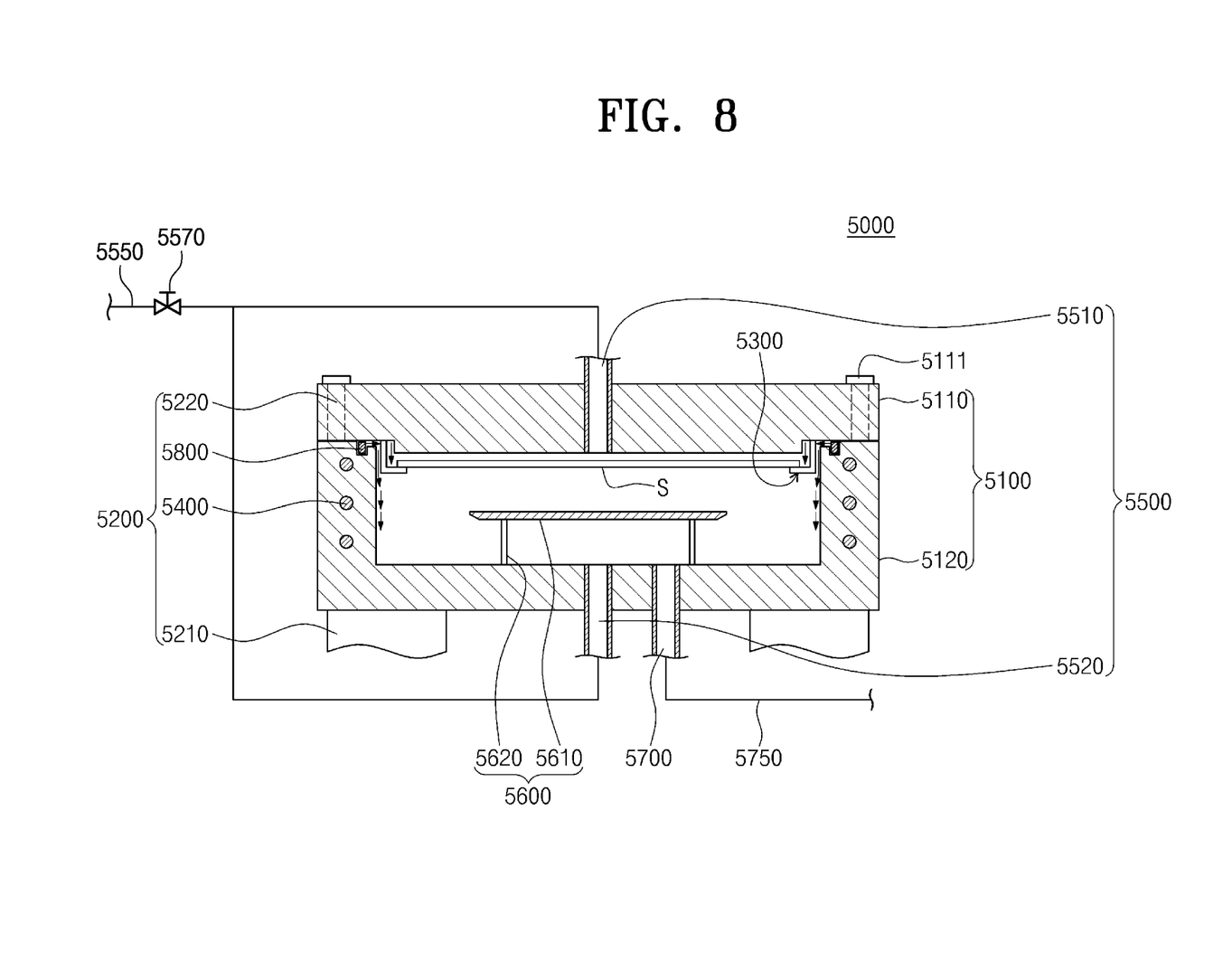
FIG. 8 is a diagram schematically illustrating an aspect of particle movement which may occur near a sealing member of the second process chamber of FIG. 5.

FIG. 8 is a diagram schematically illustrating an aspect of particle movement which may occur near a sealing member of the second process chamber of FIG. 5. In FIG. 8, an arrow schematically represents a trajectory of particles in the second process chamber. As shown in FIG. 8, particles may be produced during the substrate treating process. The particle may be deposited on the sealing member 5800. When an inner pressure of the housing 5100 is decreased after the supercritical dry process, the particles may be moved onto the substrate S, due to a difference in pressure between the inner and outer spaces of the housing 5100.

However, according to example embodiments of the inventive concept, since the upper body 5110 includes the protruding portion 5130 and the recessed region 5150, it is possible to reduce the number of particles moving toward the substrate S and thereby to improve efficiency of the substrate cleaning process.

Figure 6:
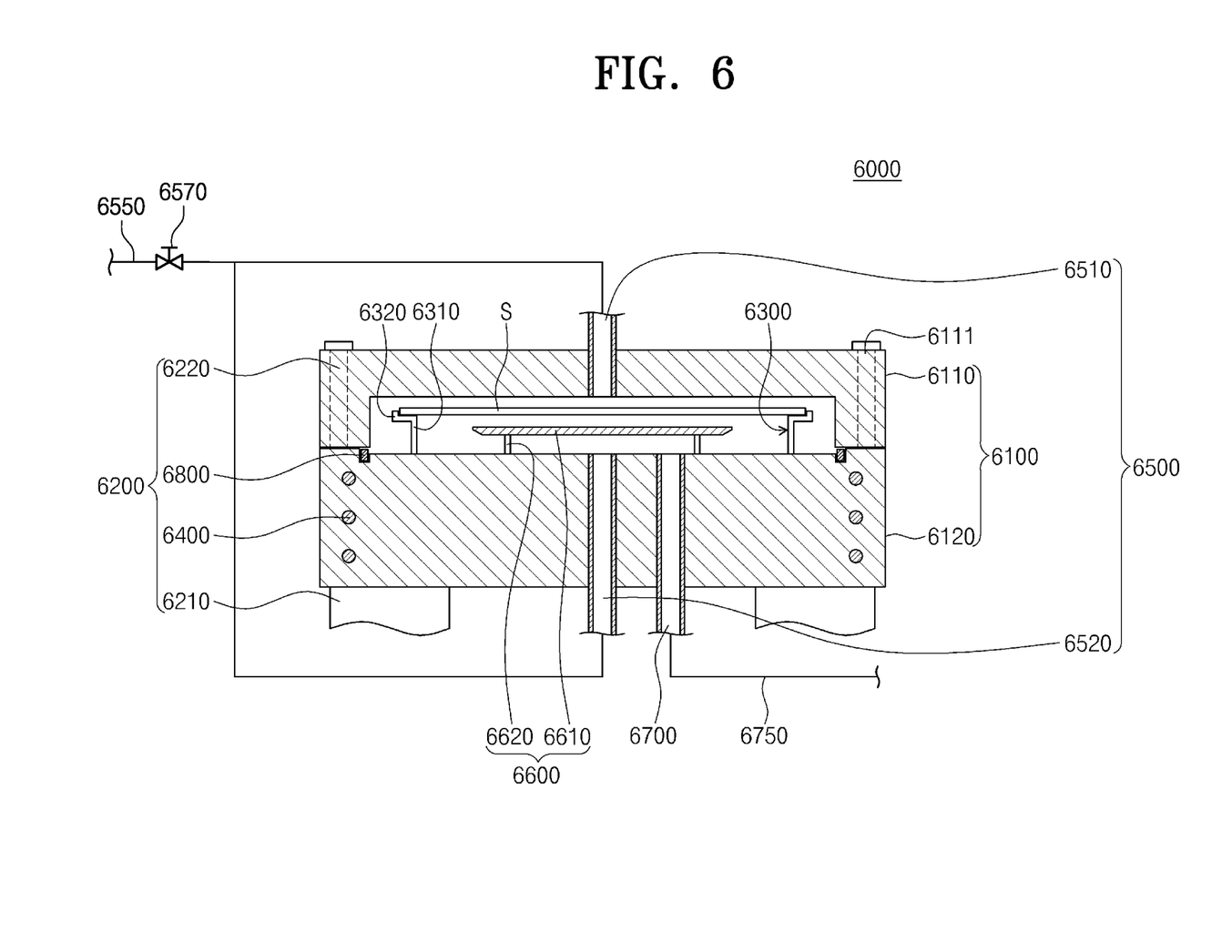
FIG. 6 is a sectional view illustrating other example of the second process chamber of FIG. 2.

FIG. 6 is a sectional view illustrating other example of the second process chamber of FIG. 2.

Referring to FIG. 6, a second process chamber 6000 may include a housing 6100, a lifting unit 6200, a supporting unit 6300, a heater 6400, a fluid supplying unit 6500, a blocking member 6600, an exhausting member 6700, and a sealing member 6800.

In example embodiments shown in FIG. 6, the housing 6100, the lifting unit 6200, the heater 6400, the fluid supplying unit 6500, and the blocking member 6600 of the second process chamber 6000 may be configured to have substantially the same features as the housing 4100, the lifting unit 4200, the heater 4400, the fluid supplying unit 4500, and the blocking member 4600 of the second process chamber 4000 described with reference to FIG. 4.

The supporting unit 6300 may be provided in the treatment space of the housing 6100 to support the substrate S. The supporting unit 6300 may be coupled to a lower body 6120. The supporting unit 6300 may include a vertical portion 6320 and a horizontal portion 6310.

The vertical portion 6320 may be installed on a bottom wall of the lower body 6120. The vertical portion 6320 may be provided to have a structure upwardly extending from the lower body 6120. The vertical portion 6320 may include an end portion that is perpendicularly connected to the horizontal portion 6310. The horizontal portion 6310 may be provided to extend from the end portion of the vertical portion 6320 toward an outer region of the housing 6100. The substrate S may be disposed on the horizontal portion 6310. The horizontal portion 6310 may support a bottom surface of an edge region of the substrate S.

Since the supporting unit 6300 may be in contact with the edge region of the substrate S to support the substrate S, the supercritical drying process may be performed on the entire top surface and most of the bottom surface of the substrate S. Here, in the substrate S, the top surface may serve as an active surface provided with patterns and the bottom surface may serve as an inactive surface without any pattern.

The exhausting member 6700 may be provided below the supporting unit 6300. The exhausting member 6700 may be provided to face the substrate S laid on the supporting unit 6300. In some embodiments, the exhausting member 6700 may be formed to pass through the lower body 6120. At a final state of the supercritical drying process, the supercritical fluid may be exhausted from the second process chamber 6000, and thus, the internal pressure of the second process chamber 6000 may be lowered below the critical pressure of the fluid, and in this case, the fluid may be liquefied. The liquefied supercritical fluid may be exhausted through the exhausting member 6700 of the lower body 6120, by the gravity.

The sealing member 6800 may hermetically isolate the treatment space from the outer space. The sealing member 6800 may be provided between an upper body 6110 and the lower body 6120 to be in contact with them. The sealing member 6800 may be positioned at a level that is substantially lower than the supporting unit 6300. In some embodiments, the sealing member 6800 may be provided to have a ring shape; for example, the sealing member 6800 may be an O-ring.

Figure 9:
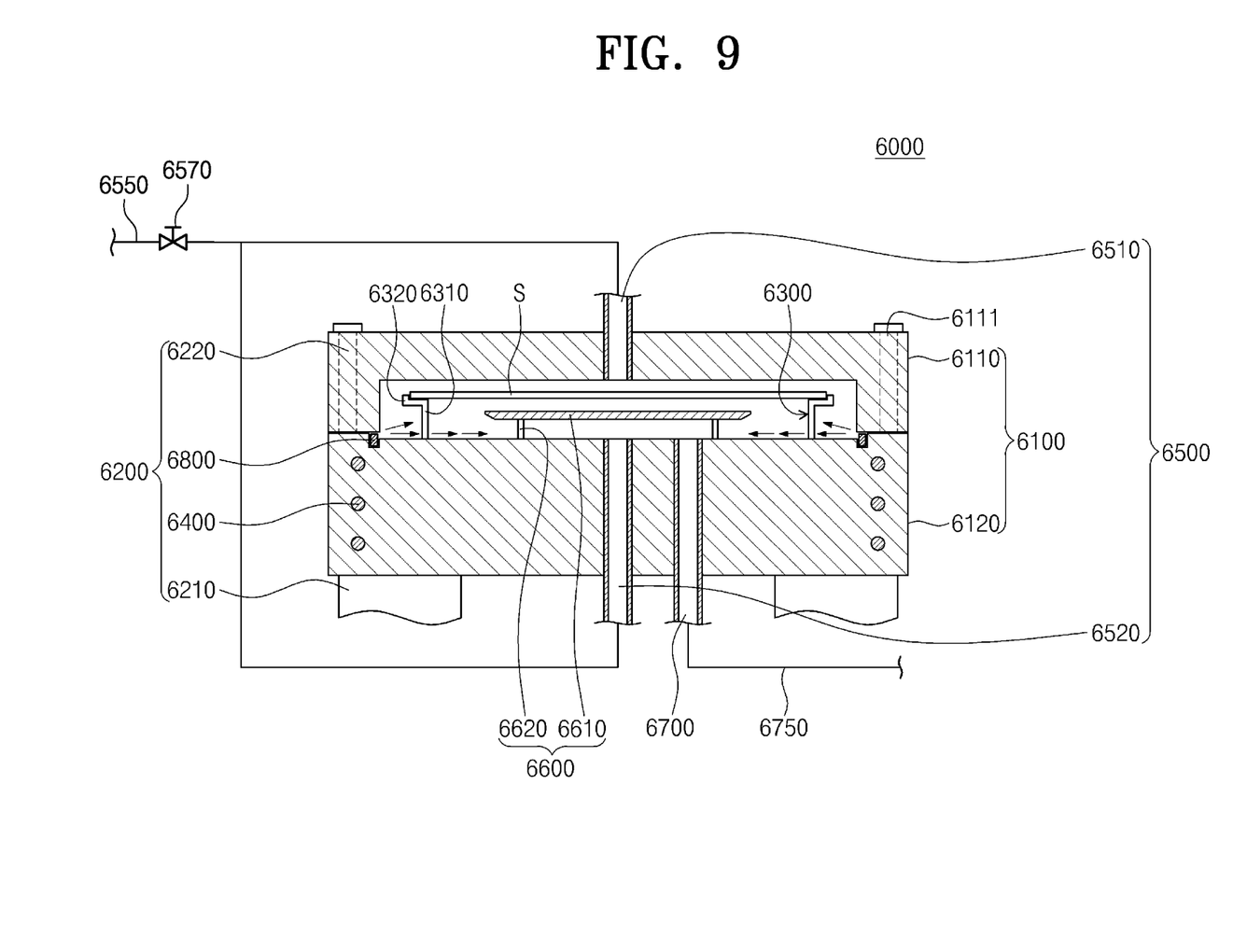
FIG. 9 is a diagram schematically illustrating an aspect of particle movement which may occur near a sealing member of the second process chamber of FIG. 6.

FIG. 9 is a diagram schematically illustrating an aspect of particle movement which may occur near a sealing member of the second process chamber of FIG. 6. In FIG. 9, an arrow schematically represents a trajectory of particles in the second process chamber. As shown in FIG. 9, particles may be produced during the substrate treating process. The particle may be deposited on the sealing member 6800. When an inner pressure of the housing 6100 is decreased after the supercritical dry process, the particles may be moved into the treatment space, due to a difference in pressure between the inner and outer spaces of the housing 6100.

However, according to example embodiments of the inventive concept, since the sealing member 6800 is positioned below the supporting unit 6300, it is possible to reduce the number of particles moving toward the substrate S and thereby to improve efficiency of the substrate cleaning process.

According to example embodiments of the inventive concept, it is possible to improve process efficiency in a process of drying a substrate using supercritical fluid.

According to example embodiments of the inventive concept, it is possible to suppress particles, which are produced near a sealing member in a process of drying a substrate using supercritical fluid, from flowing onto a substrate.

While example embodiments of the inventive concepts have been particularly shown and described, it will be understood by one of ordinary skill in the art that variations in form and detail may be made therein without departing from the spirit and scope of the attached claims.

What is claimed is:

1. A substrate treating apparatus, comprising:
   a housing including an upper body and a lower body coupled to each other to define a treatment space, the lower body being provided below the upper body along a first direction;
   a supporting unit coupled to the upper body, the supporting unit supporting an edge of a substrate disposed in the treatment space;
   a fluid supplying unit configured to supply fluid into the treatment space;
   a sealing member provided between and in contact with the upper and lower bodies, the sealing member hermetically isolating the treatment space from an outer space; and
   an isolation plate installed between and spaced apart from the sealing member and the supporting unit, wherein the isolation plate is provided to face the sealing member,
   wherein the isolation plate is installed to the upper body and has a downwardly protruding structure extending into the treatment space, whose bottom is positioned below a top surface of an inner wall of the lower body, and
   wherein the isolation plate overlaps the sealing member and the supporting unit along a second direction orthogonal to the first direction.

2. The substrate treating apparatus of claim 1, wherein the isolation plate is provided to have a ring shape.

3. The substrate treating apparatus of claim 2, wherein the supporting unit comprises:
   a vertical portion downwardly extending from the upper body; and
   a horizontal portion inwardly extending from an end portion of the vertical portion toward an inner region of the housing and supporting a bottom surface of the substrate.

4. The substrate treating apparatus of claim 2, wherein the fluid supplying unit comprises an upper fluid supplying part configured to directly supply the fluid onto a top surface of the substrate supported by the supporting unit.

5. The substrate treating apparatus of claim 1, wherein the fluid supplied through the fluid supplying unit is a supercritical fluid.

* * * * *